US012660618B2

(12) United States Patent
Chun et al.

(10) Patent No.: US 12,660,618 B2
(45) Date of Patent: Jun. 16, 2026

(54) THERMAL MANAGEMENT SYSTEMS AND METHODS FOR SEMICONDUCTOR DEVICES

(71) Applicant: Avago Technologies International Sales Pte. Limited, Singapore (SG)

(72) Inventors: Hyunsuk Chun, Irvine, CA (US); Reza Sharifi, Irvine, CA (US); Kian Yeow Gan, Irvine, CA (US); Nicole A. Butel, Fort Collins, CO (US); Jin Seong Choi, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 502 days.

(21) Appl. No.: 18/309,218

(22) Filed: Apr. 28, 2023

(65) Prior Publication Data

US 2024/0363473 A1     Oct. 31, 2024

(51) Int. Cl.
| | |
|---|---|
| *H01L 23/367* | (2006.01) |
| *H10W 40/22* | (2026.01) |
| *H10W 72/00* | (2026.01) |
| *H10W 72/30* | (2026.01) |
| *H10W 90/00* | (2026.01) |

(52) U.S. Cl.
CPC ...... *H10W 40/22* (2026.01); *H10W 72/07354* (2026.01); *H10W 72/325* (2026.01); *H10W 72/347* (2026.01); *H10W 72/352* (2026.01); *H10W 72/353* (2026.01); *H10W 72/354* (2026.01); *H10W 90/734* (2026.01); *H10W 90/736* (2026.01)

(58) Field of Classification Search
CPC ..... H01L 23/3675; H01L 24/29; H01L 24/32; H01L 24/33
See application file for complete search history.

(56) References Cited

U.S. PATENT DOCUMENTS

| | | | |
|---|---|---|---|
| 9,646,910 B2 | 5/2017 | Ahuja et al. | |
| 2006/0227510 A1 | 10/2006 | Fitzgerald et al. | |
| 2013/0285233 A1 * | 10/2013 | Bao ...................... | H01L 23/427 257/E23.101 |

(Continued)

OTHER PUBLICATIONS

Mahajan, R., Thermal Interface Materials: A Brief Review of Design Characteristics and Materials, Electronics Cooling, 2004, 10(1), 16 pages.

(Continued)

*Primary Examiner* — Dale E Page
*Assistant Examiner* — Wilner Jean Baptiste
(74) *Attorney, Agent, or Firm* — Quarles & Brady LLP

(57) ABSTRACT

The present invention is directed to semiconductor devices and integrated circuit packaging. In a specific embodiment, a semiconductor device with a heat spreader structure is provided. The heat spreader is configured to couple to a second layer to establish an effective thermal dissipation path for heat generated from a hot spot of a circuit. The second layer comprises a first portion and a second portion. The first portion is coupled to the hot spot. The heat spreader comprises a third portion and a fourth portion. The third portion comprises a protrusion coupled to the first portion via a first side surface. There are other embodiments as well.

19 Claims, 5 Drawing Sheets

(56)          References Cited

U.S. PATENT DOCUMENTS

| 2016/0247742 | A1 | | 8/2016 | Vadhavkar et al. | |
| 2021/0028084 | A1 | * | 1/2021 | Chan Arguedas | .. H01L 23/3675 |

OTHER PUBLICATIONS

Naghibi, S. et al., Noncuring Graphene Thermal Interface Materials for Advanced Electronics, Advanced Electronic Materials, 2020, 1901303, pp. 1-9.
European Patent Office, Extended Search Report, Application No. 24172456.6, Sep. 6, 2024, 9 pages.

\* cited by examiner

THERMAL MANAGEMENT SYSTEMS AND METHODS FOR SEMICONDUCTOR DEVICES

FIELD

The present invention is directed to semiconductor devices and manufacturing methods thereof.

BACKGROUND OF THE INVENTION

With the growing demand for high-performance and compact electronic devices, thermal management becomes an increasingly important aspect of modern packaging technology to ensure the proper functioning and reliability of integrated circuits (ICs). Inadequate thermal management can lead to performance degradation, reliability issues, and even complete failure of the ICs. One of the major challenges in thermal management is to maintain the operating temperature of the IC within a specified range, which can vary depending on the type of IC and its application. Another challenge is to ensure the efficient transfer of heat from the IC to the package, which in turn needs to be dissipated to the environment. The design and material selection of the package play an important role in thermal management. A package with good thermal conductivity and low thermal resistance helps ensure efficient heat transfer. Another challenge is to prevent layer delamination caused by various reasons including external thermos-mechanical stress, moisture accumulation, thermal gradients, and/or other environmental factors. Overall, thermal management in IC packaging requires a careful balance between design, material selection, and the optimization of thermal performance.

Over the years, various conventional systems and methods have been described, but they are inadequate. New and improved packaging systems and methods for semiconductor devices are desired.

BRIEF DESCRIPTION OF THE DRAWINGS

A further understanding of the nature and advantages of particular embodiments may be realized by reference to the remaining portions of the specification and the drawings, in which reference numerals are used to refer to similar components. In some instances, a sub-label is associated with a reference numeral to denote one of the multiple similar components. When reference is made to a reference numeral without specification to an existing sub-label, it is intended to refer to all such multiple similar components.

DETAILED DESCRIPTION OF THE INVENTION

Figure 1A:
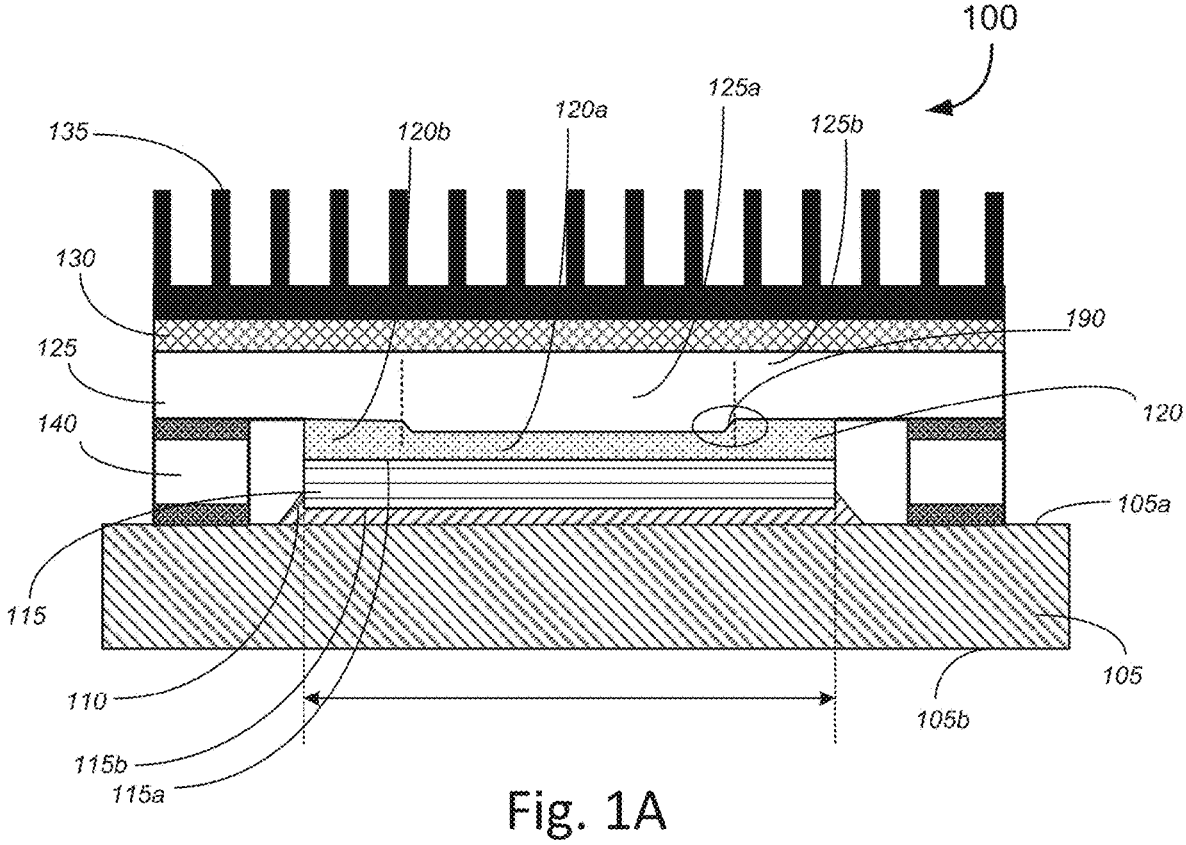
FIGS. 1A-1B are schematic diagrams illustrating cross-sectional views of various non-limiting examples of a semiconductor device, in accordance with various embodiments.

The present invention is directed to semiconductor devices and integrated circuit packaging. In a specific embodiment, a semiconductor device with a heat spreader structure is provided. The heat spreader is configured to couple to a second layer to establish an effective thermal dissipation path for heat generated from a hot spot of a circuit. The second layer comprises a first portion and a second portion. The first portion is coupled to the hot spot. The heat spreader comprises a third portion and a fourth portion. The third portion comprises a protrusion coupled to the first portion via a first side surface. There are other embodiments as well.

Various industry standards for thermal management have been developed to ensure efficient heat transfer, such as the use of thermal interface material (TIM), which is used to improve the thermal conductivity and interface between two surfaces, usually between a heat-generating component (e.g., an integrated circuit) and a cooling component (e.g., a heat spreader or a heat sink). For example, TIM includes TIM1 and TIM2. TIM1 is provided between the circuit and heat spreader of the package. TIM2 is provided between the heat spreader and the heat sink. TIM1 and TIM2 can be made of different materials, such as solder, gel, grease, metal, or liquid metal, depending on the desired thermal conductivity, electrical conductivity, adhesion, and compatibility with other components. The increasing demand for high-performance computing (HPC) applications like artificial intelligence and cloud computing is driving up device power dissipation to over 1,000 W. This growth is hindered by lidded packages and their components' thermal resistance (e.g., measured by the property of TIM1) and thermo-mechanical properties (e.g., measured by Young's modules, coefficients of thermal expansion, etc.). For example, the use of TIM1 can reduce the junction temperature (e.g., the temperature at the center of the IC) by 10-15° C., allowing for further miniaturization and function integration, but are vulnerable to interface delamination failure caused by external thermo-mechanical stress. To improve both the thermal and thermo-mechanical performance of TIM1 for high-power devices, a semiconductor device with improved thermal management features is provided.

It is to be appreciated that embodiments of the present invention provide many advantages over conventional techniques. By strategically adjusting the bond line thickness (BLT)—the thickness of the TIM1 between a heat source (e.g., an integrated circuit or a die) and a cooling component (e.g., a heat sink, a heat spreader, or other cooling devices)—in different areas, a semiconductor device can maximize heat transfer and minimize the risk of interface delamination. For instance, by reducing the BLT in hot spot areas, the heat transfer from the integrated circuit to the heat spreader is optimized, reducing the risk of system failure caused by overheating. On the other hand, thickening the BLT in the edge area of the integrated circuit helps to reduce the risk of delamination and cracking, which can occur under high thermal and mechanical stress. The thermal management features according to embodiments of the present disclosure allow for easy fabrication and high detectability, leading to increased reliability and longevity of the product.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected" or "coupled" to another element, it is to be understood that the elements can be directly connected to the other element, or have intervening elements present between the elements. It is to be appreciated that the element can be fully or partially coupled to the other element. For example, the entire area of the element may be coupled to the other element, or only a portion of the element is coupled to the other element. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise, and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and the use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require the selection of at least one of each item listed; rather, the phrase allows a meaning that includes at least one of any one of the items, and/or at least one of any combination of the items. By way of example, the phrases "at least one of A, B, and C" or "at least one of A, B, or C" each refers to only A, only B, or only C; and/or any combination of A, B, and C. In instances where it is intended that a selection be of "at least one of each of A, B, and C," or alternatively, "at least one of A, at least one of B, and at least one of C," it is expressly described as such.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

In an exemplary embodiment, the present disclosure provides a semiconductor device. The semiconductor device includes a substrate, which may include a first top surface and a first bottom surface. The semiconductor device also includes a first layer coupled to the first top surface. The semiconductor device also includes a circuit, which may include a second top surface and a second bottom surface. The second bottom surface is coupled to the first layer. The semiconductor device further includes a second layer coupled to the second top surface. The second layer may include a first portion and a second portion. The first portion is characterized by a first thickness. The second portion is characterized by a second thickness. The second thickness is greater than the first thickness. The semiconductor device also includes a heat spreader coupled to the second layer. The heat spreader may include a third portion and a fourth portion. The third portion is coupled to the fourth portion. The third portion may include a protrusion coupled to the first portion. The protrusion may include a first side surface coupled to a second side surface of the second layer.

Implementations may include one or more of the following features. The third portion of the heat spreader may be positioned at a center of the heat spreader. The second layer may be configured to provide thermal conductivity between the circuit and the heat spreader. The circuit may include a first hot spot and the first portion of the second layer is configured to be coupled to the first hot spot. The third portion of the heat spreader may include a first surface, the fourth portion of the heat spreader may include a second surface, and the first side surface of the heat spreader is coupled between the first surface and the second surface. The second surface and the first side surface define a first angle, the first angle may be greater than 90 degrees. The first angle may be smaller than 165 degrees. The third portion of the heat spreader is characterized by a third thickness, the fourth portion of the heat spreader is characterized by a fourth thickness, and the third thickness is greater than the fourth thickness. The protrusion of the heat spreader is characterized by a first height, and the first height may be greater than 10 μm. The first height may be less than 500 μm. The second portion of the second layer is coupled to the fourth portion of the heat spreader. Implementations of the described techniques may include hardware, a method or process, or computer software on a computer-accessible medium.

According to another embodiment, the present invention provides a semiconductor device that includes a substrate. The substrate may include a first top surface and a first bottom surface. The semiconductor device also includes a first layer coupled to the first top surface. The semiconductor device also includes a circuit, which may include a second top surface and a second bottom surface, the second bottom surface being coupled to the first layer. The semiconductor device may further include a second layer coupled to the second top surface of the circuit. The second layer may include a first portion and a second portion, the first portion being characterized by a first thickness and a first thermal resistance, the second portion being characterized by a second thickness and a second thermal resistance, the second thickness being greater than the first thickness. The semiconductor device may further include a heat spreader coupled to the second layer, the heat spreader may include a third portion and a fourth portion, the third portion being coupled to the fourth portion, the fourth portion being coupled to the second portion of the second layer. The third portion may be characterized by a third thickness. The fourth portion may be characterized by a fourth thickness. The third thickness may be greater than the fourth thickness. Other embodiments of this aspect include corresponding computer systems, apparatus, and computer programs recorded on one or more computer storage devices, each configured to perform the actions of the methods.

Implementations may include one or more of the following features. The semiconductor device may include a second layer coupled to the heat spreader. The semiconductor device may include a heat sink coupled to the second layer. Implementations of the described techniques may include hardware, a method or process, or computer software on a computer-accessible medium.

According to yet another embodiment, the present invention provides a semiconductor device that includes a substrate, which may include a first top surface and a first bottom surface. The semiconductor device also includes a first layer coupled to the first top surface. The semiconductor device also includes a circuit, which may include a second top surface and a second bottom surface, the second bottom surface being coupled to the first layer. The semiconductor device may also include a second layer coupled to the second top surface, the second layer may include a first portion and a second portion. The first portion is characterized by a first thickness. The second portion is characterized by a second thickness. The second thickness may be greater than the first thickness. The semiconductor device may further include a heat spreader coupled to the second layer. The heat spreader may include a third portion and a fourth portion. The third portion is coupled to the fourth portion. The third portion may include a first side surface coupled to the first portion, and the fourth portion may be coupled to the second portion. Other embodiments of this aspect include corresponding computer systems, apparatus, and computer programs recorded on one or more computer storage devices, each configured to perform the actions of the methods.

Implementations may include one or more of the following features. The circuit is characterized by a first length. The third portion of the heat spreader is characterized by a second length. The second length may be less than nine-tenth of the first length. The semiconductor device may include a stiffener ring coupled to the heat spreader. The first portion of the second layer is characterized by a first thermal resistance. The second portion of the second layer is characterized by a second thermal resistance. The first thermal resistance may be less than the second thermal resistance. The third portion is characterized by a third thickness. The fourth portion is characterized by a fourth thickness. The third thickness may be greater than the fourth thickness. A top portion of the circuit may be positioned within a cavity of the heat spreader. Implementations of the described techniques may include hardware, a method or process, or computer software on a computer-accessible medium.

Figure 1B:
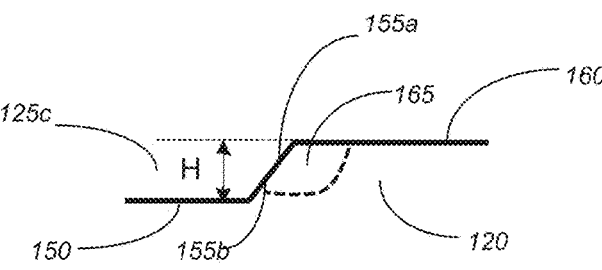

FIGS. 1A-1B are schematic diagrams illustrating cross-sectional views of various non-limiting examples of a semiconductor device, in accordance with various embodiments. These diagrams are merely examples, which should not unduly limit the scope of the claims. One of ordinary skill in the art would recognize many variations, alternatives, and modifications.

Semiconductor device 100 as illustrated in FIG. 1A, includes a substrate 105. As an example, substrate 105 comprises the board that connects the semiconductor chip to the external components and can be subject to mechanical stress during handling, assembly, and operation. A substrate may serve as the base material for mounting and interconnecting the active components, such as transistors, diodes, and integrated circuits. For example, substrate 105 may be made of a material that is an insulator or a low-resistivity conductor, such as ceramic or fiberglass. Depending on the implementation, substrate 105 can have one or more metal layers added to it, forming a metal-insulator-metal (MIM) or metal-insulator-semiconductor (MIS) structure, which allows for the electrical connections between the active components and the external environment. These metal layers can be patterned to form interconnections, bond pads, and other features that allow for the electrical and mechanical connection of the package to the outside world. In some packages, such as ball grid array (BGA) packages, substrate 105 may also have a layer of conductive balls or bumps that provide the electrical connection to the external environment. The substrate in a semiconductor package can also have via holes or trenches filled with metal to provide electrical connections between metal layers or to the opposite side of the substrate.

Substrate 105 includes a first top surface 105a and a first bottom surface 105b. The first top surface may be coupled to circuit 115 via a first layer 110. For example, circuit 115 comprises an integrated circuit, and it may also be referred to as a chip, or die, depending on context. In various implementations, in addition to first layer 110, circuit 115 may be electrically coupled to substrate 105 via electrical connections (not shown), which may include solder points that provide both electrical and mechanical coupling between circuit 115 and substrate 105.

In some embodiments, first layer 110 is coupled to the first top surface 105a. First layer 110 may refer to an underfill component. Underfill is a process in which a material is filled in between the circuit and the substrate to enhance the mechanical stability and reliability of the package. For example, first layer 110 may include multiple materials or layers. The multiple materials or layers may be configured in different shapes. In various embodiments, first layer 110 comprises resin (e.g., semi-transparent and/or translucent) and filler material. First layer 110 may include additional materials (e.g., flow agents, adhesion promoters, and/or dyes, etc.). For example, first layer 110 may comprise a thermosetting epoxy resin that is dispensed as a liquid between the circuit and the substrate, and then cured to form a solid. First layer 110 is configured to provide support and helps to distribute stress from circuit 115 to substrate 105, reducing the thermal stress and mechanical stress that circuit 115 would otherwise experience during thermal cycling and mechanical shock, especially with a heat sink mounted on its top via a TIM1 later, as described in further detail below.

According to some embodiments, circuit 115 includes a second top surface 115a and a second bottom surface 115b. Second bottom surface 115b may be coupled to first layer 110. Among other features, first layer 110 improves the reliability and performance of semiconductor device 100. First layer 110 can also provide electrical and thermal benefits. For example, it can improve electrical performance by reducing parasitic capacitance between circuit 115 and substrate 105. In various embodiments, first layer 110 is thermally conductive and can help to dissipate heat generated by circuit 115.

In various implementations, semiconductor device 100 further includes a second layer 120 coupled to the second top surface 115a. As an example, second layer 120 includes a layer of thermal interface material (TIM1), and it is positioned between circuit 115 and heat spreader 125. For instance, TIM1 provides thermal conductivity between circuit 115 and heat spreader 125, and it fills the gap between the circuit and the heat spreader, reducing the thermal resistance and allowing heat to be efficiently transferred from circuit 115 to heat spreader 125. In some cases, second layer 120 may include multiple materials or layers. The multiple materials and/or layers may be configured in different shapes. For example, TIM1 comprises one or more materials with high thermal conductivity (e.g., at least 0.01 W/cm-K, and can be as high as 0.1 W/cm-K). Depending on the implementation, TIM1 can be in the form of a paste, a sheet, a gel, an adhesive, or a pre-formed shape that is placed between circuit 115 and heat spreader 125.

When operating, circuit 115 includes one or more hot spots, which includes a first hot spot (not shown). For example, hot spots refer to areas of a semiconductor device that experience excessive heat generated during normal operation, which can cause a variance in temperature ranging from 5° C. to 30° C. across a chip, resulting in increased thermal resistance and reduced system reliability. Hot spots may also cause delamination, warping, and/or other mechanical problems. Hot spots may occur in various locations across circuit 115 due to localized heating. For example, hot spots are often caused by the presence of high-power density regions within the device, such as high-density transistors or other heat-generating components. In some cases, hot spots can also be caused by uneven power distribution, improper thermal management design, and/or poor heat sink attachment. Depending on the implementations, hot spots may be located at a center of circuit 115. It is to be appreciated that "center" refers to the central region or area of the circuit that is positioned a certain distance (e.g., a third of a width of the circuit) away from the edges of the circuit 115. For example, center may refer to the middle one third or one fourth area of circuit 115. Hot spots can be detected using various semiconductor failure analysis techniques (e.g., microthermography techniques, lithography techniques). For instance, microthermography techniques involves using thermal imagers to measure the natural emission of infrared radiation from the hot spots. In some embodiments, lithography techniques involve predicting the lithography result on a wafer by physically simulating the lithography process to find corresponding hot spots on a layout.

As shown in FIG. 1A, second layer 120 includes a first portion 120a and a second portion 120b. For example, first portion 120a is characterized by a first thickness and a first thermal resistance. The second portion 120b is characterized by a second thickness and a second thermal resistance. Thermal resistance refers to a measure of the ability of a material or structure to resist the flow of heat through it. Thermal resistance may be defined as the ratio of the temperature difference across the material (e.g., the second layer 120) to rate of heat flow through the material and may be calculated as follows:

$$R = \frac{\Delta T}{q}$$

where R is the thermal resistance in units of ° C./W, ΔT is the temperature difference across the material (e.g., second layer 120) in units of ° C., and q is the rate of heat flow through the material in units of W. Thermal resistance is an important practical characteristic that is associated with not only the material properties but also the geometry of the semiconductor configuration (e.g., the size of the component area, the thickness of TIM1, interfacial effect, etc.). In an example, the second thickness of second portion 120b is greater than the first thickness of first portion 120a, resulting in a higher thermal resistance for the second portion compared to the first portion. For example, thermal resistance may be attributed to device thickness. In some embodiments, the first portion 120a is configured to be coupled to the first hot spot for heat dissipation.

Semiconductor device 100 further includes heat spreader 125. For example, heat spreader refers to a component provided between semiconductor devices and heat sinks to efficiently transfer heat away from heat-generating components (e.g., circuits). In some cases, heat spreader 125 includes a metal plate (e.g., copper or aluminum), which is highly conductive and can quickly transfer heat away from the heat-generating component (e.g., circuit 115). In some embodiments, heat spreader 125 may include composite material that combines different materials to achieve the desired thermal properties. For instance, heat spreader 125 comprises a high-thermal-conductivity material (e.g., a layer of diamond) combined with a metal material (e.g., copper or aluminum) to achieve enhanced thermal performance.

Heat spreader 125 is coupled-thermally and perhaps mechanically—to second layer 120 to create a thermal path for transferring heat generated by circuit 115 (e.g., at the first hot spot) to heat sinks. The thermal resistance may arise at an interface where two dissimilar materials (e.g., second layer 120 and heat spreader 125) make contact, and surface irregularities and air entrapped therein may increase the thermal resistance. For instance, when heat spreader 125 is coupled to an edge of second layer 120, air bubbles (a poor conductor of heat) may be trapped therebetween, thereby causing an undesirable increase in thermal resistance. As shown in FIG. 1A, a chamfer or round shape configuration is implemented at region 190 (e.g., the interface between second layer 120 and heat spreader 125), creating a gradual transition that allows for a tight seal and eliminates entrapped air, as described in further detail below.

Heat spreader 125 includes a third portion 125a and a fourth portion 125b coupled to each other. Third portion 125a is characterized by a third thickness and fourth portion 125b is characterized by a fourth thickness. The third thickness may be greater than the fourth thickness. For instance, third portion 125a includes a protrusion 125c coupled to first portion 120a, which establishes an efficient thermal path for conducting heat away from circuit 115. FIG. 1B is a schematic diagram illustrating a cross-sectional view of region A of FIG. 1A. As shown, protrusion 125c of third portion 125a includes a first side surface 155a coupled to a second side surface 155b of second layer 120, which eliminates the entrapped air by configuring first side surface 155a to sit flush against second side surface 155b without leaving any gaps therebetween.

As shown in FIG. 1B, protrusion 125c includes first surface 150 and first side surface 155b. The fourth portion 125b may include a second surface 160. First side surface 155a may be coupled between first surface 150 and second surface 160. For example, second surface 160 and first side surface 155a define a first angle 165. In some cases, first angle 165 is greater than 90 degrees and smaller than 165 degrees, which allows for a gradual transition at the interface between second layer 120 and heat spreader 125 to avoid entrapped air that impedes the heat dissipation. In certain configurations, protrusion 125c is characterized by a first height H, which may be greater than 10 μm and less than 500

μm to ensure efficient heat transfer. The protrusion 125c creates an additional contact area between heat spreader 125 and its surroundings (e.g., second layer 120), thereby allowing for effective heat transfer and optimal thermal management.

Referring back to FIG. 1A, semiconductor device 100 may further include a second layer 130, which may be coupled to the heat spreader 125. In some embodiments, second layer 130 is coupled to heat sink 135. Second layer 130 may include a layer of thermal interface material (TIM2). As an example, TIM2 is a material used to improve the thermal conductivity between heat spreader 125 and heat sink 135, and it fills the gap between the heat spreader and the heat sink, reducing the thermal resistance and allowing heat to be efficiently transferred from heat spreader 125 to heat sink 135. For example, TIM comprises one or more materials with high thermal conductivity (e.g., at least 0.01 W/cm-K, but may be as high as 0.1 W/cm-K), such as metals (e.g., aluminum, copper, or silver), ceramics, graphite, silicone pads, non-silicone-based gap fillers, polyurethane foams or gels, thermally-conductive additives, and/or polymer composites. TIM2 may have sufficient conformability to fill the microscopic gaps and irregularities between the surfaces (e.g., between heat spreader 125 and heat sink 135), which would otherwise create a thermal barrier and reduce the effectiveness of heat dissipation. Depending on the implementation, TIM2 may be in the form of a paste, a sheet, or a pre-formed shape that is placed between heat spreader 125 and heat sink 135.

In various implementations, heat sink 135 is thermally coupled to heat spreader 125 via second layer 130 (e.g., TIM2) to dissipate heat generated by circuit 115. Heat sink 135 acts as a thermal conduit, transferring the heat generated by circuit 115 to the environment, thereby keeping the temperature of circuit 115 within acceptable limits to ensure the optimal operation of semiconductor devices. For example, the heat sink comprises materials with high thermal conductivity, such as aluminum, copper, or graphite. Heat sink 135 has a large surface area (e.g., larger than the surface area of circuit 115) for heat dissipation. Depending on the implementation, the heat sink can be in the form of a simple block, a finned structure, or a more complex shape with multiple fins. Heat sinks may also be used in combination with other cooling solutions, such as fans or liquid cooling systems, to further enhance thermal performance. A thermally conductive path can thus be established from the heat source (e.g., circuit 115) to the environment through second layer 120 (e.g., TIM1), heat spreader 125, second layer 130 (e.g., TIM2), and heat sink 135.

According to some embodiments, semiconductor device 100 further includes a stiffener 140 coupled to heat spreader 125. Stiffener refers to a component that is used to provide additional mechanical support to the semiconductor package. Stiffeners are typically made from materials with a high modulus (e.g., $9 \times 106$ to $30 \times 106$ psi), such as ceramics, composites, or metal alloys, and can be attached to the backside of the package substrate. The stiffener may cover the entire surface of the substrate or be placed strategically to support specific areas that are more prone to stress. It is to be noted that although stiffener 140 appears as two separate stiffeners in the cross-sectional representation of FIG. 1A, stiffener 140 can also represent a single, concentric stiffener. In an example, stiffener 140 is coupled between heat spreader 125 and substrate 105 to provide additional rigidity and support to heat spreader 125 and prevent deformation or warping. In some cases, stiffener 140 has a coefficient of thermal expansion that is substantially the same as that of substrate 205 and/or heat spreader 125. Stiffener 140 may be coupled to the heat spreader 125 and/or substrate 205 using adhesives, soldering, or other bonding methods. The use of stiffener 140 can improve the reliability and performance of semiconductor device 100 by ensuring that the heat spreader 125 remains flat and in close contact with circuit 115, which maximizes the thermal conductivity and efficiency of the heat transfer process.

Figure 2:
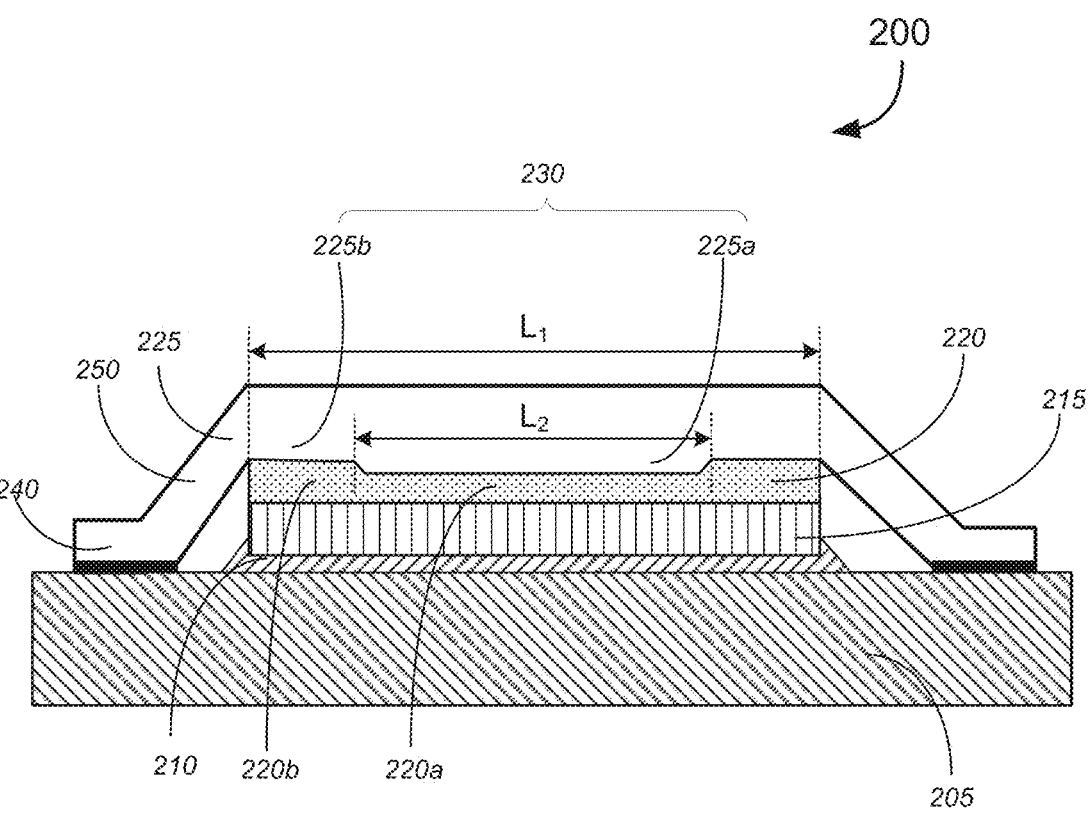
FIG. 2 is a schematic diagram illustrating a cross-sectional view of a semiconductor device, in accordance with various embodiments.

FIG. 2 is a schematic diagram illustrating a cross-sectional view of a semiconductor device, in accordance with various embodiments. This diagram is merely an example, which should not unduly limit the scope of the claims. One of ordinary skill in the art would recognize many variations, alternatives, and modifications.

Semiconductor device 200 as illustrated in FIG. 2, includes a substrate 205. As an example, a substrate may serve as the base material for mounting and interconnecting the active components, such as transistors, diodes, and integrated circuits. For example, substrate 205 may be made of a material that is an insulator or a low-resistivity conductor, such as ceramic or fiberglass. Depending on the implementation, substrate 205 can have one or more metal layers added to it, forming a metal-insulator-metal (MIM) or metal-insulator-semiconductor (MIS) structure, which allows for the electrical connections between the active components and the external environment. These metal layers can be patterned to form interconnections, bond pads, and other features that allow for the electrical and mechanical connection of the package to the outside world. In some packages, such as ball grid array (BGA) packages, substrate 205 may also have a layer of conductive balls or bumps (not shown) that provide the electrical connection to the external environment.

In some embodiments, substrate 205 includes a first top surface and a first bottom surface. The first top surface may be coupled to a circuit 215 via a first layer 210. For example, circuit 215 comprises an integrated circuit, and it may also be referred to as a chip, or die, depending on context. In various implementations, in addition to first layer 210, circuit 215 may be electrically coupled to substrate 205 via electrical connections (not shown), which may include solder points that provide both electrical and mechanical coupling between circuit 215 and substrate 205.

In some embodiments, first layer 210 is coupled to the first top surface of substrate 205. First layer 210 may refer to an underfill component. Underfill is a process in which a material is filled in between the circuit and the substrate to enhance the mechanical stability and reliability of the package. For example, first layer 210 may include multiple different materials and/or layers. The multiple materials or layers may be configured in different shapes. In various embodiments, first layer 210 comprises resin (e.g., semi-transparent and/or translucent) and filler material. First layer 210 may include additional materials (e.g., flow agents, adhesion promoters, and/or dyes, etc.). For example, first layer 210 may comprise a thermosetting epoxy resin that is dispensed as a liquid between the circuit and the substrate, and then cured to form a solid. First layer 210 is configured to provide support and helps to distribute stress from circuit 215 to substrate 205, reducing the thermal stress and mechanical stress that circuit 215 would otherwise experience during thermal cycling and mechanical shock, especially with a heat sink mounted on its top via a TIM1 later, as explained above.

According to some embodiments, circuit 215 includes a second top surface and a second bottom surface. The second bottom surface of circuit 215 may be coupled to first layer

210. Among other features, first layer 210 improves the reliability and performance of semiconductor device 200. First layer 210 can also provide electrical and thermal benefits. For example, it can improve electrical performance by reducing parasitic capacitance between circuit 215 and substrate 205. In various embodiments, first layer 210 is thermally conductive and can help to dissipate heat generated by circuit 215.

In various implementations, semiconductor device 200 further includes a second layer 220 coupled to the second top surface of circuit 215. As an example, second layer 220 includes a layer of TIM1, and it is positioned between circuit 215 and a heat spreader 225. For instance, TIM1 is a material used to improve the thermal conductivity between circuit 215 and heat spreader 225, and it fills the gap between the circuit and the heat spreader, reducing the thermal resistance and allowing heat to be efficiently transferred from circuit 215 to heat spreader 225. In some cases, second layer 220 may include multiple materials or layers. The multiple materials or layers may be configured in different shapes. For example, TIM1 comprises one or more materials with high thermal conductivity (e.g., at least 0.01 W/cm-K, and can be as high as 0.1 W/cm-K), such as metals (such as aluminum, copper, or silver), ceramics, or polymer composites. Depending on the implementation, TIM1 can be in the form of a paste, a sheet, a gel, an adhesive, or a pre-formed shape that is placed between circuit 215 and heat spreader 225.

In various embodiments, circuit 215 includes a first hot spot (not shown). For example, hot spots refer to areas of a semiconductor device that experience excessive heat generated during normal operation, which can cause a variance in temperature ranging from 5° C. to 30° C. across a chip, resulting in increased thermal resistance and reduced system reliability. Hot spots are often caused by the presence of high-power density regions within the device, such as high-density transistors or other heat-generating components. In some cases, hot spots can also be caused by uneven power distribution, improper thermal management design, and/or poor heat sink attachment. Depending on the implementations, hot spots may be located at a center of circuit 215. It is to be appreciated that "center" refers to the central region or area of the circuit that is positioned a certain distance (e.g., a third of a width of the circuit) away from the edges of the circuit 215. For example, center may refer to the middle one third or one fourth area of circuit 215. Hot spots can be detected using various semiconductor failure analysis techniques (e.g., microthermography techniques, lithography techniques). For instance, microthermography techniques involves using thermal imagers to measure the natural emission of infrared radiation from hot spots. In some embodiments, lithography techniques involve predicting the lithography result on a wafer by physically simulating the lithography process to find corresponding hot spots on a layout.

In some embodiments, second layer 220 includes a first portion 220a and a second portion 220b. For example, first portion 220a is characterized by a first thickness and a first thermal resistance. The second portion 220b is characterized by a second thickness and a second thermal resistance. Thermal resistance may be defined as the ratio of the temperature difference across the material (e.g., the second layer 220) to rate of heat flow through the material and may be calculated as follows:

$$R = \frac{\Delta T}{q}$$

where R is the thermal resistance in units of ° C./W, $\Delta T$ is the temperature difference across the material (e.g., second layer 220) in units of ° C., and q is the rate of heat flow through the material in units of W. Thermal resistance is an important practical characteristic that is associated with not only the material properties but also the geometry of the semiconductor configuration (e.g., the size of the component area, the thickness of TIM1, interfacial effect, etc.). For example, the second thickness of second portion 220b is greater than the first thickness of first portion 220a, resulting in a higher thermal resistance for second portion 220b compared to first portion 220a. In some embodiments, the first portion 220a is configured to be coupled to the first hot spot for heat dissipation.

In various implementations, semiconductor device 200 further includes a heat spreader 225. For example, heat spreader refers to a component used in semiconductor devices to efficiently transfer heat away from heat-generating components (e.g., ICs), such as microprocessors or graphics processing units (GPUs), to prevent overheating and maintain optimal operating temperatures. Depending on the implementations, heat spreader 225 may include one or more of a drop-in heat spreader, vapor chamber heat spreader, heat sink, and heat pipes. In some cases, heat spreader 225 includes a metal plate (e.g., copper or aluminum), which is highly conductive and can quickly transfer heat away from the heat-generating component (e.g., circuit 215). In some embodiments, heat spreader 225 may include composite material that combines different materials to achieve the desired thermal properties. For instance, heat spreader 225 may include a high-thermal-conductivity material (e.g., a layer of diamond) combined with a metal material (e.g., copper or aluminum) to achieve enhanced thermal performance.

Heat spreader 225 is thermally coupled to second layer 220 to create a thermal path for dissipating heat generated by circuit 215 (e.g., at the first hot spot). The thermal resistance may arise when two dissimilar materials make contact (e.g., second layer 220 and heat spreader 225), and surface irregularities and air entrapped therein can also increase the thermal resistance. For instance, when heat spreader 225 is coupled to an edge of second layer 220, air bubbles-poor conductors of heat—may be trapped therebetween, causing the increase in thermal resistance.

Additionally, the interface between second layer 220 and heat spreader 225 is mechanically a weak link with a high risk of interface delamination due to various reasons such as mismatch in thermos-mechanical properties (e.g., Yong's modules, coefficients of thermal expansion, hydro-swelling), external thermal loading (e.g., residual stress), and other environmental factors (e.g., moisture). For example, delamination refers to the separation or detachment of two layers or interfaces that are bonded together. When materials with different properties (e.g., different thermal expansion coefficients) are bonded together, they expand and contract differently under changing temperature and humidity conditions, which leads to the build-up of residual stresses at the interface. These residual stresses, combined with external mechanical loading and/or thermal cycling, can initiate and propagate cracks at the interface, leading to delamination.

In various implementations, heat spreader 225 is coupled to substrate 205 and a top portion of the circuit 215 is positioned within a cavity of the heat spreader 225. In some cases, heat spreader 225 may be configured to enclose circuit 215. For instance, as shown in FIG. 2, heat spreader 225 includes a top portion 230 and a bottom portion 240. Top portion 230 is configured to couple to second layer 220 and includes a third portion 225a and fourth portion 225b. Third portion 225a and fourth portion 225b may be coupled to each other. In an example, third portion 225a includes a protrusion coupled to first portion 220a, which establishes an efficient thermal path for conducting heat away from circuit 215. The protrusion of heat spreader 225 may have a small area (e.g., smaller than the second top surface of circuit 215). For example, circuit 215 is characterized by a first length $L_1$, and third portion 225a is characterized by a second length $L_2$. The second length $L_2$ may be less than nine-tenth of the first length $L_1$ to ensure a sufficient delamination margin. In some embodiments, third portion 225a may be positioned at the center of heat spreader 225, corresponding to a center region of circuit 215. It is to be appreciated that "center" refers to the central region or area of the heat spreader/circuit that is positioned a certain distance (e.g., a third of a width of the heat spreader/circuit) away from the edges of the heat spreader/circuit. For example, center may refer to the middle one third or one fourth area of the heat spreader 225. Fourth portion 225b may be coupled to second portion 220b, which has a greater thickness compared to first portion 220a. Second portion 220b may be configured to couple to an edge area of circuit 215 where there is a higher risk of interface delamination, allowing for a greater delamination margin to minimize the risk of delamination.

In some embodiments, bottom portion 240 of heat spreader 225 forms an open end and is configured to couple to substrate 205. Heat spreader 225—including top portion 230 and bottom portion 240—encloses circuit 215 from a top side (e.g., the second top surface) and lateral sides (e.g., two side surfaces that are perpendicular to the second top surface). As shown in FIG. 2, heat spreader 225 may further include a connecting portion 250 configured to adjoin top portion 230 and bottom portion 240. Connecting portion 250 may be characterized by an inclined surface to improve heat dissipation over a large area. Heat spreader 225 is configured to provide environmental protection, electromagnetic interference shielding, and efficient cooling solutions for circuit 215 to ensure the reliability and longevity of semiconductor device 200.

Figure 3:
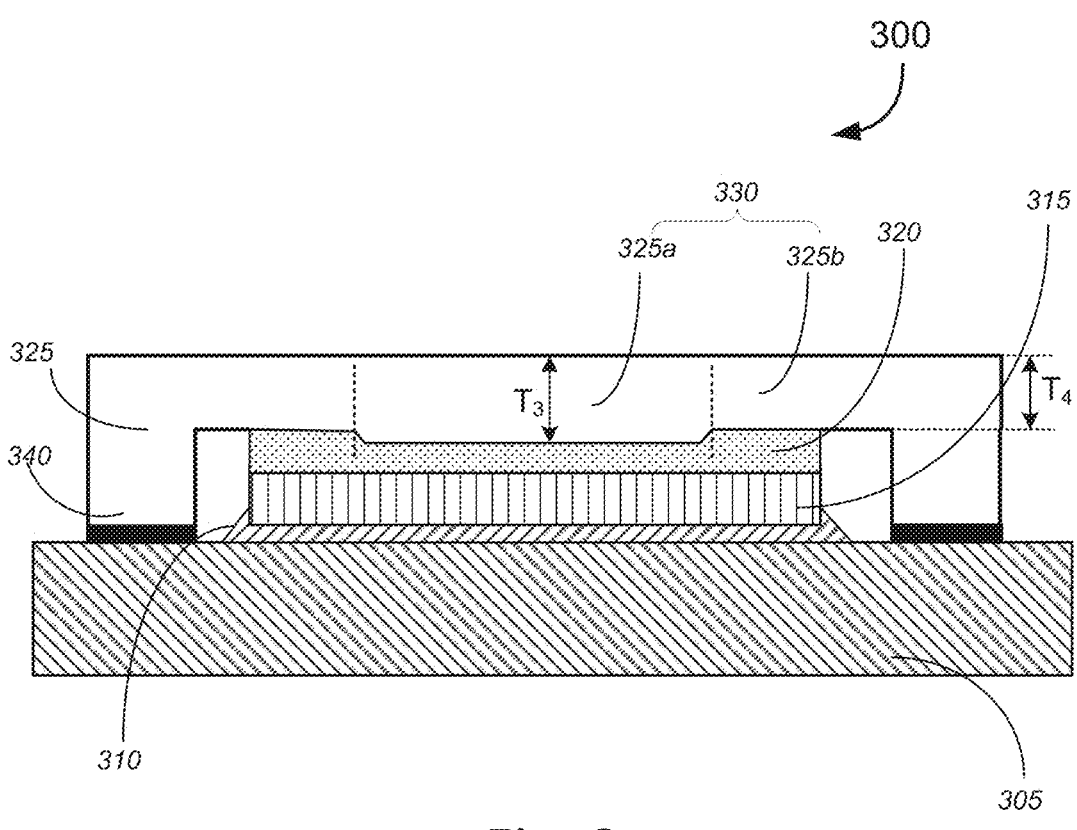
FIG. 3 is a schematic diagram illustrating a cross-sectional view of a semiconductor device, in accordance with various embodiments.

FIG. 3 is a schematic diagram illustrating a cross-sectional view of a semiconductor device, in accordance with various embodiments. This diagram is merely an example, which should not unduly limit the scope of the claims. One of ordinary skill in the art would recognize many variations, alternatives, and modifications.

Semiconductor device 300 as illustrated in FIG. 3, includes a substrate 305. As an example, a substrate may serve as the base material for mounting and interconnecting the active components, such as transistors, diodes, and integrated circuits. For example, substrate 305 may be made of a material that is an insulator or a low-resistivity conductor, such as ceramic or fiberglass. Depending on the implementation, substrate 305 can have one or more metal layers added to it, forming a metal-insulator-metal (MIM) or metal-insulator-semiconductor (MIS) structure, which allows for the electrical connections between the active components and the external environment. These metal layers can be patterned to form interconnections, bond pads, and other features that allow for the electrical and mechanical connection of the package to the outside world. In some packages, such as ball grid array (BGA) packages, substrate 305 may also have a layer of conductive balls or bumps (not shown) that provide the electrical connection to the external environment.

In some embodiments, substrate 305 includes a first top surface and a first bottom surface. The first top surface may be coupled to a circuit 315 via a first layer 310. For example, circuit 315 comprises an integrated circuit, and it may also be referred to as a chip, or die, depending on context. In various implementations, in addition to first layer 310, circuit 315 may be electrically coupled to substrate 305 via electrical connections (not shown), which may include solder points that provide both electrical and mechanical coupling between circuit 315 and substrate 305.

In some embodiments, first layer 310 is coupled to the first top surface of substrate 305. First layer 310 may refer to an underfill component. Underfill is a process in which a material is filled in between the circuit and the substrate to enhance the mechanical stability and reliability of the package. For example, first layer 310 may include multiple different materials or layers. The multiple materials or layers may be configured in different shapes. In various embodiments, first layer 310 comprises resin (e.g., semi-transparent and/or translucent) and filler material. First layer 310 may include additional materials (e.g., flow agents, adhesion promoters, and/or dyes, etc.). For example, first layer 310 may comprise a thermosetting epoxy resin that is dispensed as a liquid between the circuit and the substrate, and then cured to form a solid. First layer is configured to provide support and helps to distribute stress from circuit 315 to substrate 305, reducing the thermal stress and mechanical stress that circuit 315 would otherwise experience during thermal cycling and mechanical shock, especially with a heat sink mounted on its top via a TIM1 later, as explained above.

According to some embodiments, circuit 315 includes a second top surface and a second bottom surface. The second bottom surface of circuit 315 may be coupled to first layer 310. Among other features, first layer 310 improves the reliability and performance of semiconductor device 300. First layer 310 can also provide electrical and thermal benefits. For example, it can improve electrical performance by reducing parasitic capacitance between circuit 315 and substrate 305. In various embodiments, first layer 310 is thermally conductive and can help to dissipate heat generated by circuit 315.

In various implementations, semiconductor device 300 further includes a second layer 320 coupled to the second top surface of circuit 315. As an example, second layer 320 includes a layer of TIM1, and it is positioned between circuit 315 and a heat spreader 325. For instance, TIM1 is a material used to improve the thermal conductivity between circuit 315 and a cooling component (e.g., heat spreader 325, as described below), and it fills the gap between the circuit and the heat spreader, reducing the thermal resistance and allowing heat to be efficiently transferred from circuit 315 to heat spreader 325. In some cases, second layer 320 may include multiple materials or layers. The multiple materials or layers may be configured in different shapes. For example, TIM1 comprises one or more materials with high thermal conductivity (e.g., at least 0.01 W/cm-K, and can be as high as 0.1 W/cm-K), such as metals (such as aluminum, copper, or silver), ceramics, or polymer composites. Depending on the implementation, TIM1 can be in the form of a paste, a sheet, a gel, an adhesive, or a pre-formed shape that is placed between circuit 315 and heat spreader 325.

In various embodiments, circuit 315 includes a first hot spot (not shown). For example, hot spots refer to areas of a semiconductor device that experience excessive heat generated during normal operation, which can cause a variance in temperature ranging from 5° C. to 30° C. across a chip, resulting in increased thermal resistance and reduced system reliability. Hot spots are often caused by the presence of high-power density regions within the device, such as high-density transistors or other heat-generating components. In some cases, hot spots can also be caused by uneven power distribution, improper thermal management design, and/or poor heat sink attachment. Depending on the implementations, hot spots may be located at a center of circuit 315. It is to be appreciated that "center" refers to the central region or area of the circuit that is positioned a certain distance (e.g., a third of a width of the circuit) away from the edges of the circuit 315. For example, center may refer to the middle one third or one fourth area of circuit 315. Hot spots can be detected using various semiconductor failure analysis techniques (e.g., microthermography techniques, lithography techniques). For instance, microthermography techniques involves using thermal imagers to measure the natural emission of infrared radiation from the hot spots. In some embodiments, lithography techniques involve predicting the lithography result on a wafer by physically simulating the lithography process to find corresponding hot spots on a layout.

In various implementations, semiconductor device 300 further includes a heat spreader 325. For example, heat spreader refers to a component used in semiconductor devices to efficiently transfer heat away from heat-generating components (e.g., ICs), such as microprocessors or graphics processing units (GPUs), to prevent overheating and maintain optimal operating temperatures. Depending on the implementations, heat spreader 325 may include one or more of a drop-in heat spreader, vapor chamber heat spreader, heat sink, and heat pipes. In some cases, heat spreader 325 includes a metal plate (e.g., copper or aluminum), which is highly conductive and can quickly transfer heat away from the heat-generating component (e.g., circuit 315). In some embodiments, heat spreader 325 may be made of a composite material that combines different materials to achieve the desired thermal properties. For instance, heat spreader 325 comprises a high-thermal-conductivity material (e.g., a layer of diamond) combined with a metal material (e.g., copper or aluminum) to achieve enhanced thermal performance.

Heat spreader 325 may be coupled to second layer 320 to create a thermal path for dissipating heat generated by circuit 315 (e.g., at the first hot spot). The thermal resistance may arise when two dissimilar materials make contact (e.g., second layer 320 and heat spreader 325), and surface irregularities and air entrapped therein can also increase the thermal resistance. For instance, when heat spreader 325 is coupled to an edge of second layer 320, air bubbles—poor conductors of heat—may be trapped therebetween, causing the increase in thermal resistance.

Additionally, the interface between second layer 320 and heat spreader 325 is a weak link with a high risk of interface delamination due to various reasons such as mismatch in thermos-mechanical properties (e.g., Yong's modules, coefficients of thermal expansion, hydro-swelling), external thermal loading (e.g., residual stress), and other environmental factors (e.g., moisture). Delamination refers to the separation or detachment of two layers or interfaces that are bonded together. When materials with different properties (e.g., coefficients of thermal expansion) are bonded together, they expand and contract differently under changing temperature and humidity conditions, which leads to the build-up of residual stresses at the interface. These residual stresses, combined with external mechanical loading and/or thermal cycling, can initiate and propagate cracks at the interface, leading to delamination.

In various implementations, heat spreader 325 is coupled to substrate 305 and a top portion of the circuit 315 is positioned within a cavity of the heat spreader 325. For instance, as shown in FIG. 3, heat spreader 325 includes a top portion 330 and a bottom portion 340. Top portion 330 is configured to couple to second layer 320 and includes a third portion 325a and fourth portion 325b coupled to each other. In an example, third portion 325a includes a protrusion coupled to second layer 320, which establishes an efficient thermal path for conducting heat away from circuit 315. For instance, third portion 325a is characterized by a third thickness $T_3$ and fourth portion 325b is characterized by a fourth thickness $T_4$. The third thickness $T_3$ may be greater than the fourth thickness $T_4$. In some cases, the protrusion of third portion 325a includes a first side surface coupled to a second side surface of second layer 320, which advantageously eliminates the entrapped air by configuring a gradual transition at the interface between heat spreader 325 and second layer 320 without leaving any gaps in between.

In some embodiments, bottom portion 340 of heat spreader 325 forms an open end and is configured to couple to substrate 305. Heat spreader 325—including top portion 330 and bottom portion 340—encloses circuit 315 from a top side (e.g., the second top surface) and lateral sides (e.g., two side surfaces that are perpendicular to the second top surface). Heat spreader 325 is configured to provide environmental protection, electromagnetic interference shielding, and efficient cooling solutions for circuit 315 to ensure the reliability and longevity of semiconductor device 300.

Figure 4A:
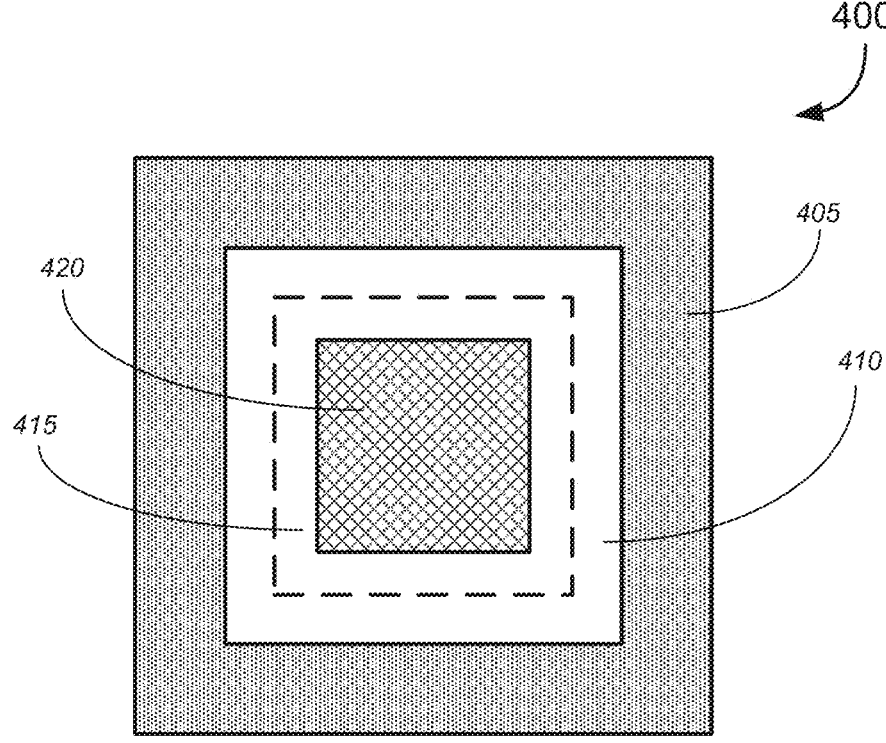
FIGS. 4A-4D are schematic diagrams illustrating top views of various non-limiting examples of a semiconductor device, in accordance with various embodiments.

FIGS. 4A-4D are schematic diagrams illustrating top views of various non-limiting examples of a semiconductor device, in accordance with various embodiments. This diagram is merely an example, which should not unduly limit the scope of the claims. One of ordinary skill in the art would recognize many variations, alternatives, and modifications. As shown in FIG. 4A, semiconductor 400 includes circuit 415, which is coupled to substrate 405. As an example, substrate 405 may serve as the base material for mounting and interconnecting the active components, such as transistors, diodes, and integrated circuits. Circuit 415 may comprise an integrated circuit, which contains a plurality of electronic components, such as transistors, capacitors, and resistors. Circuit 415 can be coupled to substrate 405 using various bonding techniques (e.g., wire bonding, flip-chip bonding, anisotropic conductive film bonding, tape automated bonding, etc.). For instance, circuit 415 may be coupled to substrate 405 via a soldering process that involves using a metal alloy (solder) that is melted and then solidified to create a strong mechanical and electrical bond. A peripheral region of circuit 415 is shown as dotted lines along the perimeter edges of circuit 415. In some embodiments, heat spreader 410 is configured to couple to circuit 415 via a layer of TIM1 (not visible). Heat spreader 410 may include a protrusion 420 that is positioned corresponding to a first hot spot (not visible) on circuit 415. In an example, as shown in FIG. 4A, the first hot spot is located at or near a center of circuit 415 relative to its peripheral region. For example, center may refer to the middle one third or one fourth area of the circuit 415. Accordingly, protrusion 420 is positioned at a center of heat spreader 410, corresponding to the location of the first hot spot. It is to be appreciated that "center" refers to the central region or area of the heat spreader/circuit that is positioned a certain distance (e.g., a third of a width of the heat spreader/circuit) away from the edges of the heat spreader/circuit. Protrusion 420 enables a thinner (compared to the peripheral region) layer of TIM1 to cover the first hot spot, which advantageously reduces thermal resistance to achieve enhanced thermal performance.

Figure 4B:
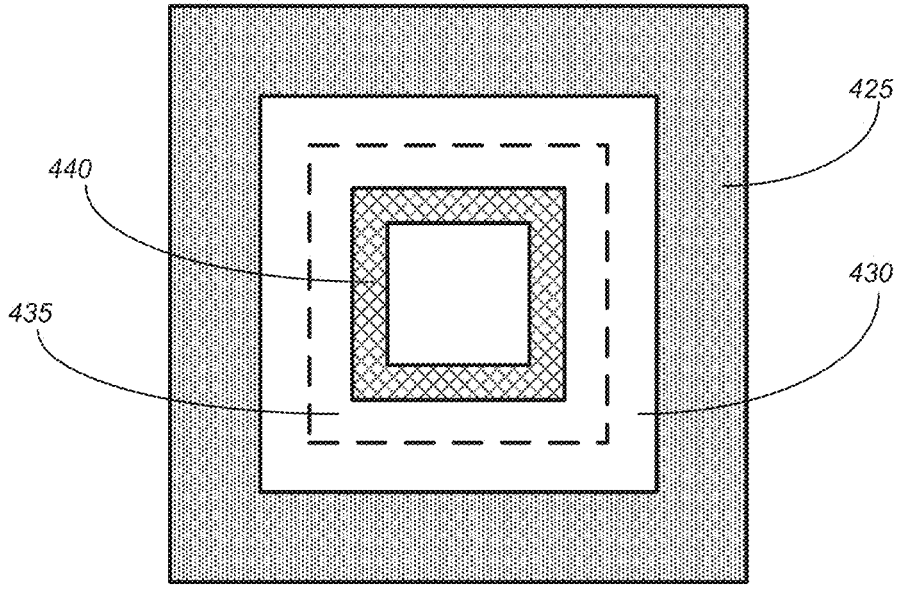

According to some embodiments, as shown in FIG. 4B, circuit 435 is coupled to a substrate 425. Heat spreader 430 is configured to couple to circuit 415 via a layer of TIM1 (not visible). Heat spreader 430 may include a protrusion 440 that is positioned corresponding to a second hot spot (not visible) on circuit 435. The second hot spot may be located around a center of circuit 435 and form a rectangular ring-shaped pattern. For example, center may refer to the middle one third or one fourth area of the circuit 435. Accordingly, protrusion 440 is positioned along a center of heat spreader 430 in a rectangular ring-shaped pattern, corresponding to the location of the second hot spot. It is to be appreciated that "center" refers to the central region or area of the heat spreader/circuit that is positioned a certain distance (e.g., a third of a width of the heat spreader/circuit) away from the edges of the heat spreader/circuit. Heat spreader 430, together with the layer of TIM1, establishes an efficient thermal path to conduct heat away from the second hot spot, ensuring the operation temperature of semiconductor 400 is within acceptable limits.

Figure 4C:
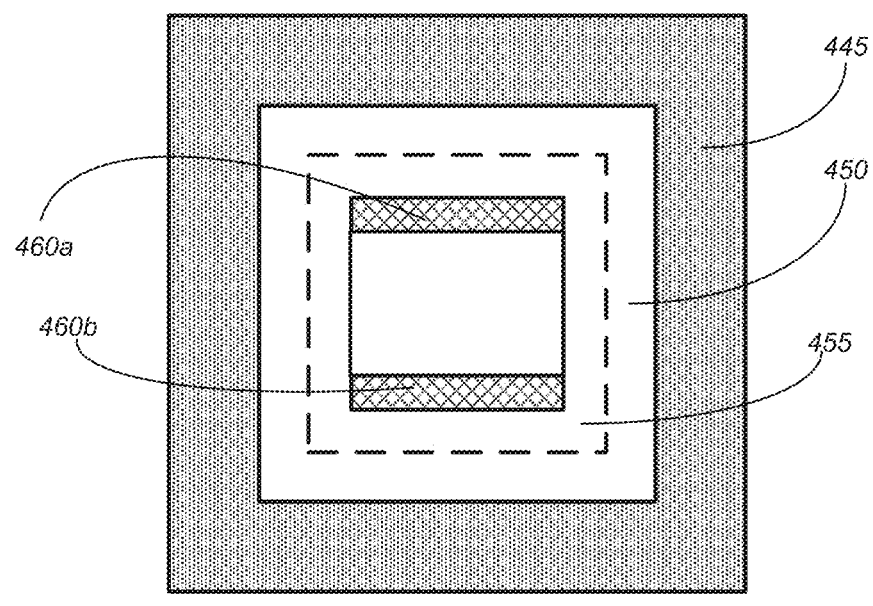

In various implementations, the protrusion of the heat spreader may be positioned along opposing sides of the heat spreader. For example, as shown in FIG. 4C, circuit 455 is coupled to substrate 445. Heat spreader 450 is configured to couple to circuit 415 via a layer of TIM1 (not visible). Heat spreader 450 may include a first protrusion 460a and a second protrusion 460b that are respectively positioned corresponding to a third hot spot and a fourth hot spot (not visible) on circuit 455. The third hot spot and the fourth hot spot may be located along opposing edges of circuit 455 (e.g., from corner to corner). Accordingly, first protrusion 460a and second protrusion 460b are positioned along opposing sides of heat spreader 450, corresponding to the locations of the third and fourth hot spots, respectively. For example, first protrusion 460a is positioned at a first side of heat spreader 450, the second protrusion 460b is positioned at a second side of heat spreader 450 opposing to the first side.

Figure 4D:
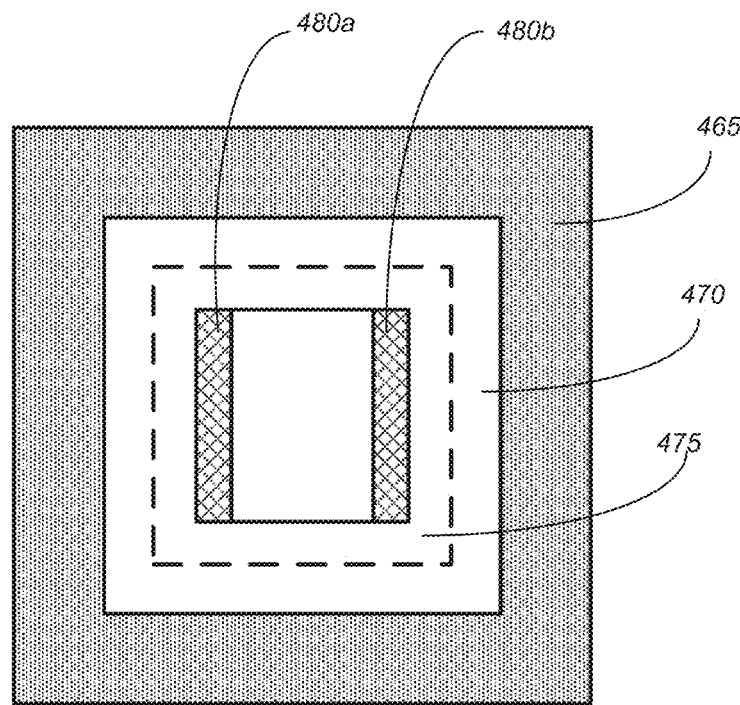

In yet another example, as shown in FIG. 4D, circuit 475 is coupled to substrate 465. Heat spreader 470 is configured to couple to circuit 475 via a layer of TIM1 (not visible). Heat spreader 470 may include a third protrusion 480a and a fourth protrusion 480b that are respectively positioned corresponding to a fifth hot spot and a sixth hot spot (not visible) on circuit 475. The fifth hot spot and the sixth hot spot may be located along opposing edges of circuit 475 (e.g., from corner to corner). Accordingly, third protrusion 480a and fourth protrusion 480b are positioned along opposing sides of heat spreader 470, corresponding to the locations of the fifth and sixth hot spots, respectively. For example, third protrusion 480a is positioned at a third side of heat spreader 470, fourth protrusion 480b is positioned at a fourth side of heat spreader 470 opposing to the third side.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A semiconductor device, comprising:
a substrate comprising a first top surface and a first bottom surface;
a first layer coupled to the first top surface;
a circuit comprising a second top surface and a second bottom surface, the second bottom surface being coupled to the first layer;
a second layer coupled to the second top surface, the second layer comprising a first portion and a second portion, the first portion being characterized by a first thickness, the second portion being characterized by a second thickness, the second thickness being greater than the first thickness;
a third layer;
a stiffener comprising a top side and a bottom side, the bottom side being coupled to the substrate; and
a heat spreader coupled to the second layer and the third layer, the heat spreader comprising a third portion and a fourth portion, the third portion being coupled to the fourth portion, the third portion comprising a protrusion coupled to the first portion, the protrusion comprising a first side surface coupled to a second side surface of the second layer, the heat spreader being coupled to the top side of the stiffener at a first interface, the first interface being at height higher than the second top surface of the circuit.

2. The semiconductor device of claim 1, wherein the third portion of the heat spreader is positioned at a center of the heat spreader.

3. The semiconductor device of claim 1, wherein the second layer is configured to provide thermal conductivity between the circuit and the heat spreader.

4. The semiconductor device of claim 1, wherein the circuit comprises a first hot spot, and the first portion of the second layer is configured to be coupled to the first hot spot.

5. The semiconductor device of claim 1, wherein:
the third portion of the heat spreader comprises a first surface;
the fourth portion of the heat spreader comprises a second surface; and
the first side surface of the heat spreader is coupled between the first surface and the second surface.

6. The semiconductor device of claim 5, wherein the second surface and the first side surface define a first angle, the first angle is greater than 90 degrees.

7. The semiconductor device of claim 6, wherein the first angle is less than 165 degrees.

8. The semiconductor device of claim 1, wherein:
the third portion of the heat spreader is characterized by a third thickness;
the fourth portion of the heat spreader is characterized by a fourth thickness; and
the third thickness is greater than the fourth thickness.

9. The semiconductor device of claim 1, wherein the protrusion of the heat spreader is characterized by a first height, and the first height is greater than 10 μm.

10. The semiconductor device of claim 9, wherein the first height is less than 500 μm.

11. The semiconductor device of claim 1 wherein the second portion of the second layer is coupled to the fourth portion of the heat spreader.

12. The semiconductor device of claim 11, further comprising a second layer coupled to the heat spreader.

13. The semiconductor device of claim 11 further comprising a heat sink coupled to the second layer.

14. A semiconductor device, comprising:
a substrate comprising a first top surface and a first bottom surface;
a first layer coupled to the first top surface;
a circuit comprising a second top surface and a second bottom surface, the second bottom surface being coupled to the first layer;
a second layer coupled to the second top surface of the circuit, the second layer comprising a first portion and a second portion, the first portion being characterized by a first thickness and a first thermal resistance, the second portion being characterized by a second thickness and a second thermal resistance, the second thickness being greater than the first thickness;
a third layer;
a stiffener comprising a top side and a bottom side, the bottom side being coupled to the substrate; and
a heat spreader coupled to the second layer and the third layer, the heat spreader comprising a third portion and a fourth portion, the third portion being coupled to the fourth portion, the fourth portion being coupled to the second portion of the second layer, the third portion being characterized by a third thickness, the fourth portion being characterized by a fourth thickness, and the third thickness being greater than the fourth thickness, the heat spreader being coupled to the top side of the stiffener at a first interface, the first interface being at height higher than the second top surface of the circuit.

15. A semiconductor device, comprising:
a substrate comprising a first top surface and a first bottom surface;
a first layer coupled to the first top surface;
a circuit comprising a second top surface and a second bottom surface, the second bottom surface being coupled to the first layer;
a second layer coupled to the second top surface, the second layer comprising a first portion and a second portion, the first portion being characterized by a first thickness, the second portion being characterized by a second thickness, the second thickness being greater than the first thickness;
a third layer;
a stiffener comprising a top side and a bottom side, the bottom side being coupled to the substrate; and
a heat spreader coupled to the second layer and the third layer, the heat spreader comprising a third portion and a fourth portion, the third portion coupled to the fourth portion, the third portion comprising a first side surface coupled to the first portion, and the fourth portion being coupled to the second portion, the heat spreader being coupled to the top side of the stiffener at a first interface, the first interface being at height higher than the second top surface of the circuit.

16. The semiconductor device of claim 15, wherein:
the circuit is characterized by a first length;
the third portion of the heat spreader is characterized by a second length; and
the second length being less than nine-tenth of the first length.

17. The semiconductor device of claim 15, wherein:
the first portion of the second layer is characterized by a first thermal resistance;
the second portion of the second layer is characterized by a second thermal resistance; and the first thermal resistance is less than the second thermal resistance.

18. The semiconductor device of claim 15, wherein:

the third portion is characterized by a third thickness;

the fourth portion is characterized by a fourth thickness; and the third thickness is greater than the fourth thickness.

19. The semiconductor device of claim 15, wherein a top portion of the circuit is positioned within a cavity of the heat spreader.

\* \* \* \* \*